United States Patent
Freitag et al.

(10) Patent No.: US 7,420,787 B2
(45) Date of Patent: Sep. 2, 2008

(54) MAGNETORESISTIVE SENSOR HAVING A SHAPE ENHANCED PINNED LAYER

(75) Inventors: James Mac Freitag, Sunnyvale, CA (US); Kuok San Ho, Santa Clara, CA (US); Mustafa Michael Pinarbasi, Morgan Hill, CA (US); Ching Hwa Tsang, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 327 days.

(21) Appl. No.: 11/204,973

(22) Filed: Aug. 15, 2005

(65) Prior Publication Data

US 2007/0035891 A1     Feb. 15, 2007

(51) Int. Cl.
*G11B 5/39* (2006.01)

(52) U.S. Cl. .................................. 360/324.1; 360/126

(58) Field of Classification Search .................. 360/324, 360/318, 320, 322, 324.2
See application file for complete search history.

(56) References Cited

U.S. PATENT DOCUMENTS

| | | | |
|---|---|---|---|
| 6,542,342 B1 * | 4/2003 | Hayashi et al. | 360/324.2 |
| 6,552,882 B1 * | 4/2003 | Hayashi | 360/324.2 |
| 2002/0085317 A1 * | 7/2002 | Hoshino et al. | 360/320 |
| 2003/0214761 A1 * | 11/2003 | Freitag et al. | 360/322 |
| 2004/0008452 A1 * | 1/2004 | Kagami et al. | 360/318 |
| 2004/0114282 A1 | 6/2004 | Pong Lee et al. | 360/322 |
| 2004/0157346 A1 | 8/2004 | Baglin et al. | 438/3 |
| 2004/0196596 A1 | 10/2004 | Ho et al. | 360/324.2 |
| 2004/0223269 A1 | 11/2004 | Wang et al. | 360/324.12 |
| 2005/0201018 A1 * | 9/2005 | Nagai et al. | 360/322 |

* cited by examiner

*Primary Examiner*—Tianjie Chen
(74) *Attorney, Agent, or Firm*—Zilka-Kotab, PC

(57) ABSTRACT

A magnetoresistive sensor having a pinned layer that extends beyond the stripe height defined by the free layer of the sensor. The extended pinned layer has a strong shape induced anisotropy that maintains pinning of the pinned layer moment. The extended portion of the pinned layer has sides beyond the stripe height that are perfectly aligned with the sides of the sensor within the stripe height. This perfect alignment is made possible by a manufacturing method that uses a mask structure for more than one manufacturing phase, eliminating the need for multiple mask alignments.

8 Claims, 22 Drawing Sheets

MAGNETORESISTIVE SENSOR HAVING A SHAPE ENHANCED PINNED LAYER

FIELD OF THE INVENTION

The present invention relates to magnetoresistive sensors and more particularly the construction of a magnetoresistive sensor having a pinned layer that is extended in the stripe height direction to increase shape induced magnetic anisotropy and thereby improve pinning.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP pinned spin valve includes first and second magnetic layers separated by a thin nonmagnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

The push for ever increased data rate and data capacity has lead a drive to make magnetoresitive sensors ever smaller. For example, designing a sensor with a narrower track width means that more tracks of data can be fit onto a given area of magnetic medium. The various dimensions of a sensor must scale together, so if the trackwidth is decreased, then the stripe height dimension (perpendicular to the ABS) must also be decreased. As sensors become ever smaller, one problem that arises is that the pinned layer becomes impracticably unstable. In fact, future generation sensors will very soon become so small that the pinned layer cannot be adequately pinned by current pinning mechanisms. This has to do with the size of the pinned layer, which makes the pinned layer itself hard to pin, as well as the reduced area on which traditional pinning mechanisms such as AFM pinning, AP coupling, and magnetostriction induced anisotropy can act.

It is known that shape can induce magnetic anisotropy in magnetic materials, which can improve the stability of the pinning. Such shape induced anisotropy could be provided by, for example, extending the pinned layer in the stripe height direction (perpendicular to the ABS) so that the pinned layer structure has a narrow deep rectangular structure.

However, the use of such designs has been prevented by such factors as: the limitations on the stripe height dimension of the free layer (to avoid shape induced anisotropy in the wrong direction on the free layer); the need to avoid shunting of sense current across the extended portion of the pinned layer, and also by currently available photolithographic techniques, such as the alignment of multiple mask structures in very small structures.

Therefore, there is a strong felt need for a sensor design, and a method of making such a sensor that will provide a strong pinned layer anisotropy perpendicular to the ABS, such as by a design the provides a shape induced anisotropy. Such a design must not, however, result in a significant amount of current shunting. Preferably, a method for manufacturing such a sensor would overcome current photolithographic limitations involved in aligning separate mask structures which has prevented the use of such pinned layer structures.

SUMMARY OF THE INVENTION

The present invention provides a method for constructing a magnetoresistive sensor having a pinned layer that extends beyond the stripe height defined by the free layer of the sensor. The extended pinned layer has a strong shape induced anisotropy that maintains pinning of the pinned layer moment. The extended portion of the pinned layer has sides beyond the stripe height that are perfectly aligned with the sides of the sensor within the stripe height. This perfect alignment is made possible by a manufacturing method that uses a single mask structure for more than one manufacturing phase, eliminating the need for multiple mask alignments.

First and second leads and hard bias structures can be formed at either side of the sensor in the area from the ABS to the stripe height defined by the free layer. These electrically conductive lead and hard bias layers however stop at this stripe height location. The areas at either side of the sensor in regions beyond the stripe height location are filled with an electrically insulating material such as alumina, which advantageously prevents shunting of sense current through the extended portion of the pinned layer.

The perfect alignment of the extended portion and active portions of the sensor advantageously makes it possible to avoid such current shunting while enhancing pinning. This perfectly aligned structure is made possible by a manufacturing process that uses a single mask in multiple, discrete manufacturing stages, eliminating the need to lithographically align separate mask structures.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
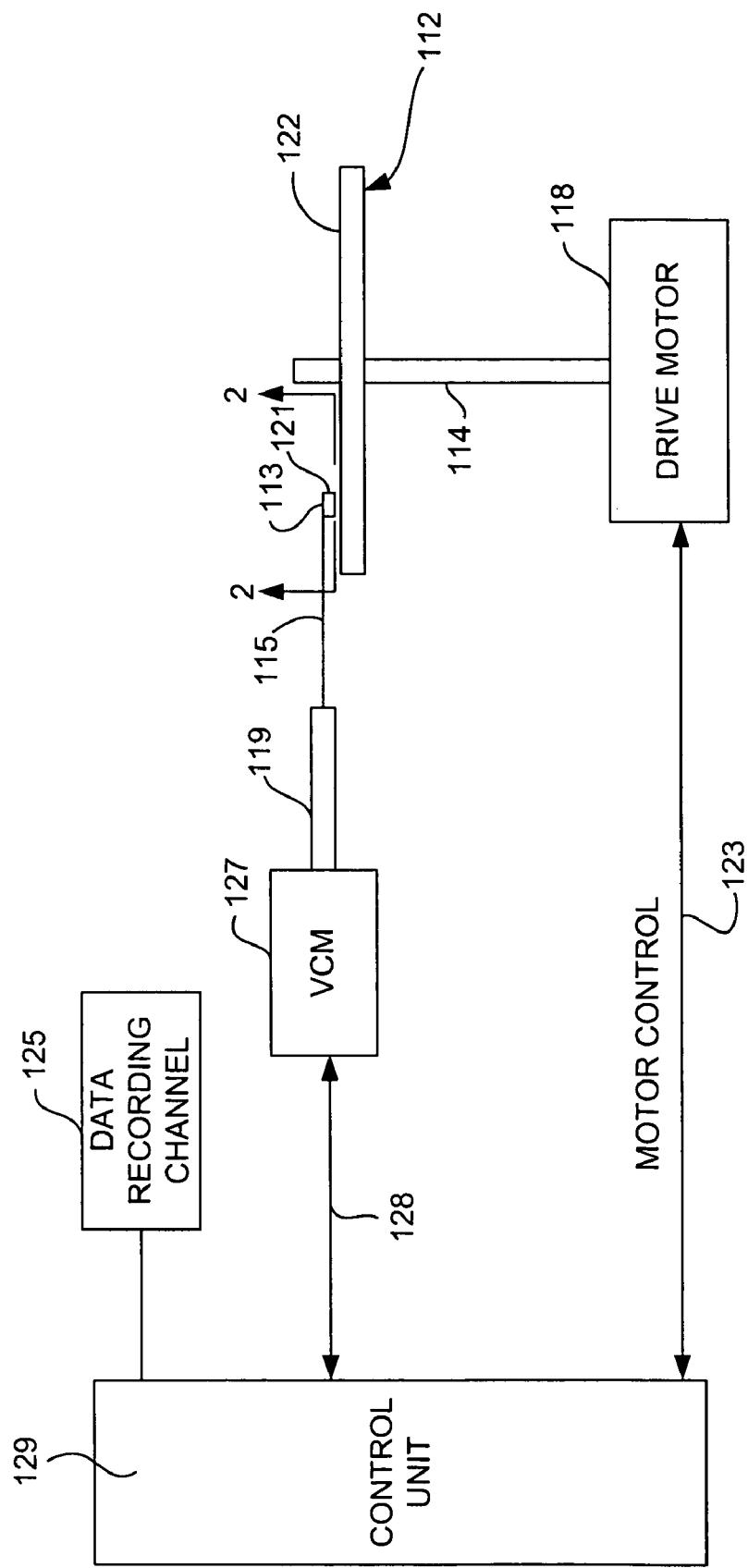
FIG. 1 is a schematic illustration of a disk drive system in which the invention might be embodied.

Referring now to FIG. 1, there is shown a disk drive 100 in which the present invention may be embodied. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
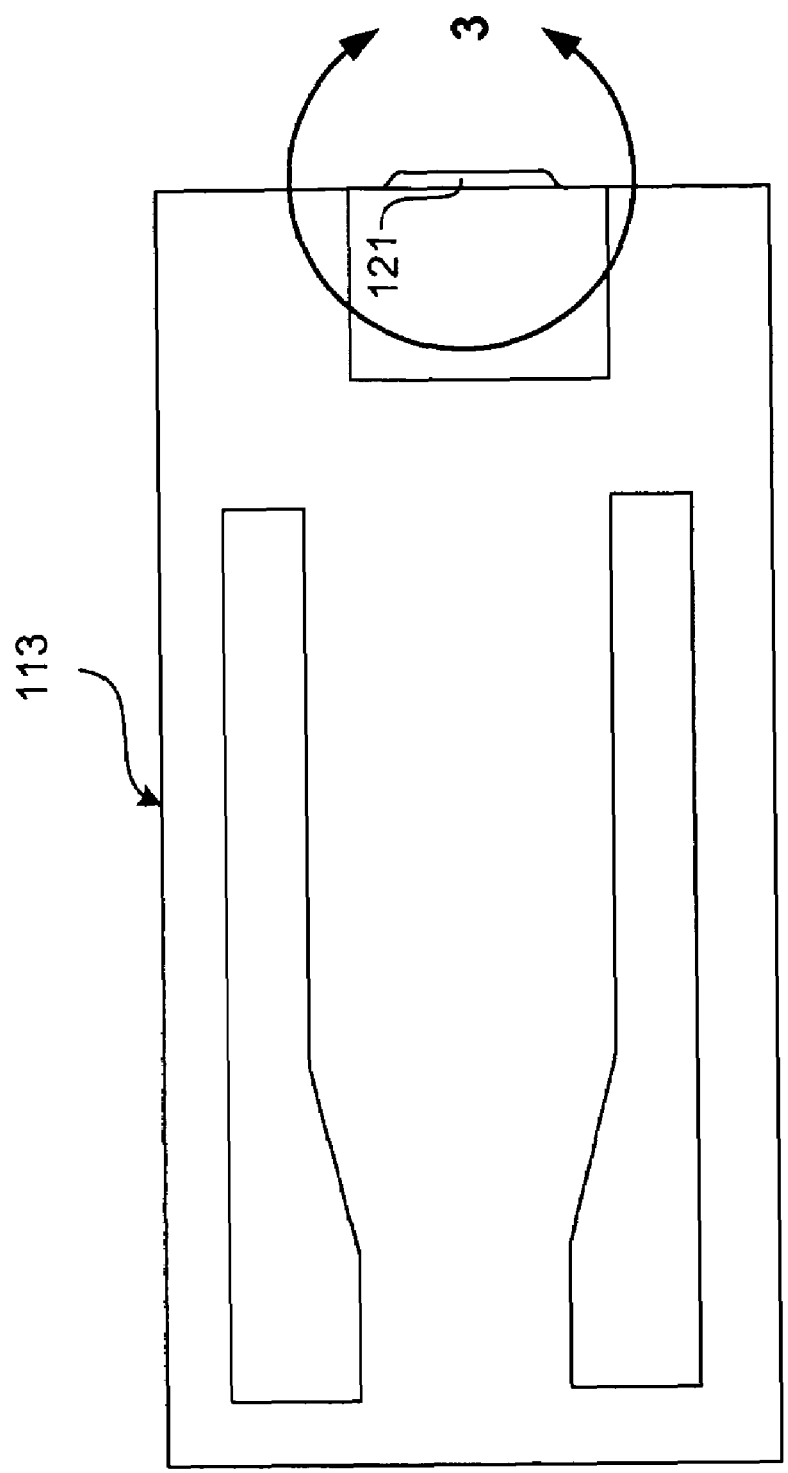
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
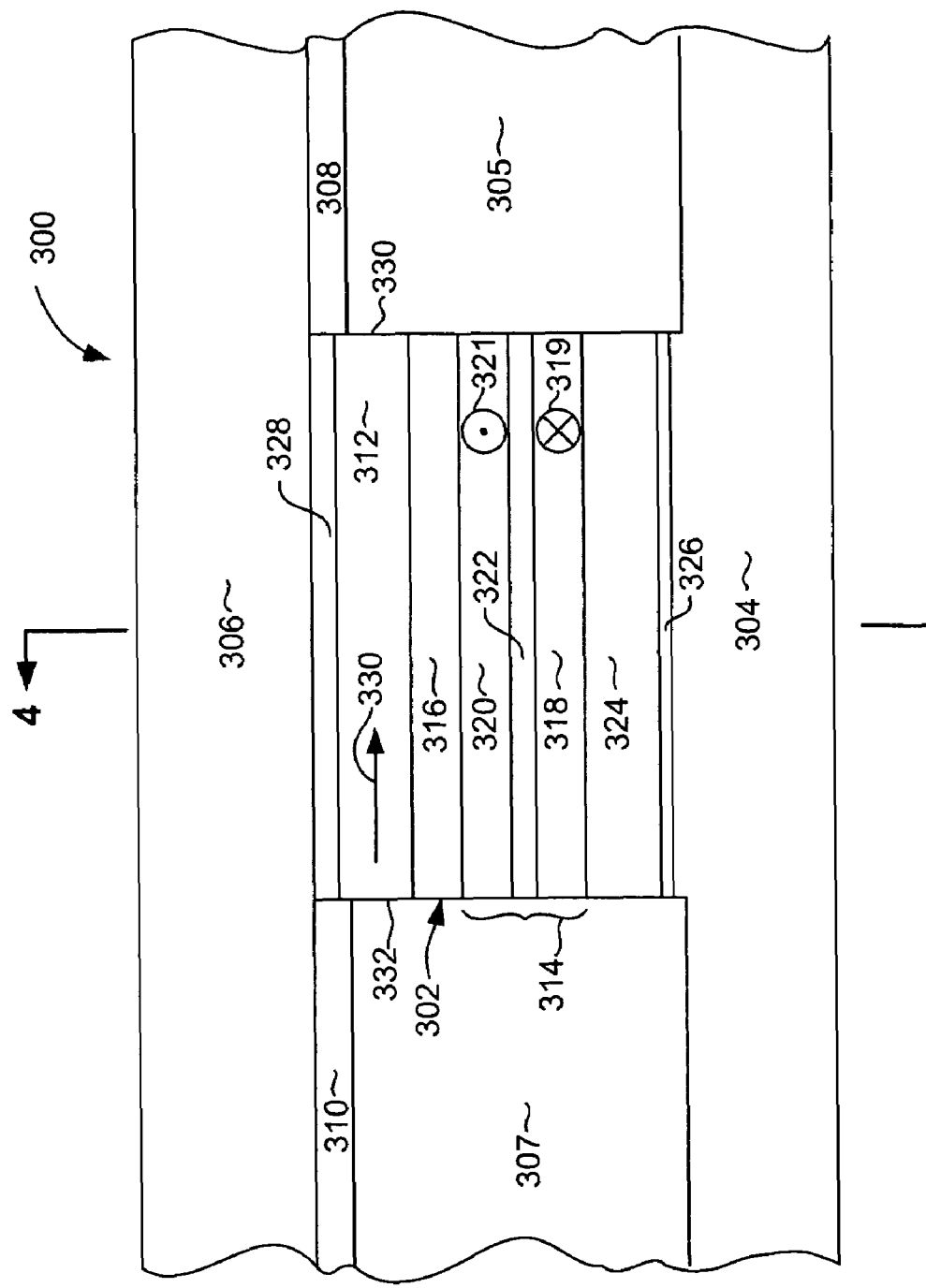
FIG. 3; is an ABS view, taken from circle 3 of FIG. 2 illustrating a sensor according to an embodiment of the invention.

With reference now to FIG. 3, a magnetoresistive sensor 300 according to an embodiment of the invention includes a magnetoresistive sensor element or sensor stack 302, sandwiched between first and second non-magnetic, electrically insulating gap layers 304, 306, which can be constructed of, for example alumina ($Al_2O_3$). First and second hard bias layers (HB) 305, 307 constructed of, for example, CoPtCr are formed at either side of the sensor to provide a magnetic bias field to bias the magnetic moment of the free layer in a direction parallel with the ABS. First and second electrically conductive lead layers 308, 310 are formed over the first and second HB layers, and extend laterally from the sides of the sensor stack 302 between the first and second gap layers 304, 306.

The sensor stack 302 includes a magnetic free layer 312, a pinned layer structure 314 and a non-magnetic, electrically conductive spacer layer 316, constructed of, for example Cu. The free layer 312 can be constructed of several magnetic materials such as Co or CoFe, or of a combination of layers of different magnetic materials.

The pinned layer structure 314 may be a simple pinned structure or an antiparallel pinned (AP pinned) structure, and may be either self pinned or AFM pinned. For purposes of illustration, the pinned layer structure 314, will be described as an AFM pinned, AP pinned layer structure having first and second ferromagnetic layers 318, 320, which are antiparallel coupled across a non-magnetic, electrically conductive AP coupling layer 322 such as Ru. The first and second magnetic layers 318, 320 can be constructed of, for example CoFe, NiFe or some combination of these or other materials. A layer of antiferromagnetic material (AFM layer) 324 is disposed beneath the pinned layer structure 314, and can be for example PtMn, IrMn or some other antiferromagnetic material. The AFM layer 324 is exchange coupled with the first magnetic layer 318 and strongly pins the magnetic moments of the magnetic layers as indicated by symbols 319, 321.

The sensor stack 302 also may include a seed layer 326 formed at the bottom of the sensor stack 302, which can be used to initiate a desired crystalline growth in the layers of the sensor stack 302. A capping layer 328, such as for example Ta or some other suitable material may be provided at the top of the sensor stack 302 to protect the layers of the sensor stack from damage during manufacturing processes such as annealing. The sensor stack 302 has first and second lateral sides 330, 332 that define the track width (TW) of the sensor. The free layer 312 has a magnetic moment 330 that is biased in a desired direction parallel with the ABS. Biasing of the moment 330 is achieved by a bias field provided by the first and second hard bias layers 305, 307.

Figure 4:
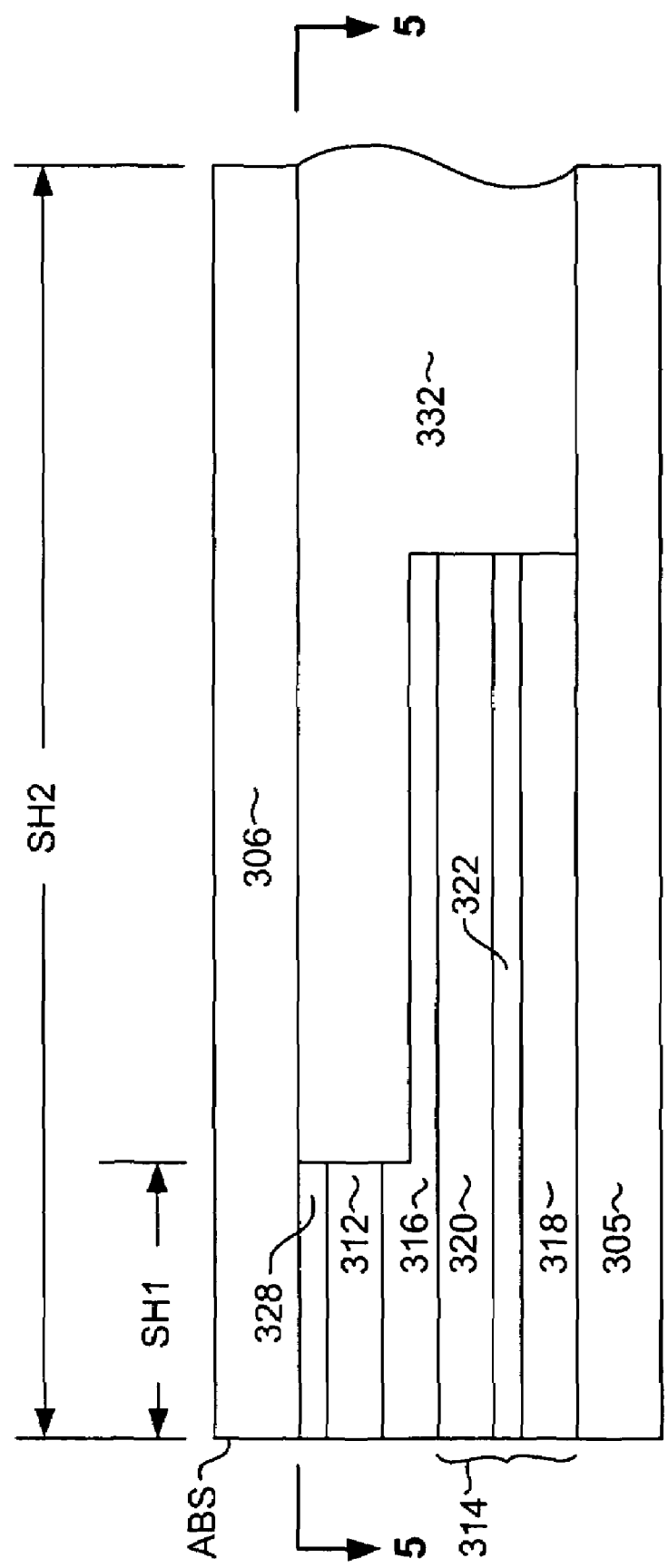
FIG. 4 is a side cross sectional view, taken from line 4-4 of FIG. 3.

With reference to FIG. 4, it can be seen that the free layer 312 extends from the ABS a first stripe height distance SH1, whereas the pinned layer 314 and possibly a portion of the spacer layer 316 extend much further from the ABS to a second stripe height distance SH2. SH2 is preferably at least larger than SH1, and is more preferably at least two times or several times SH1. As those skilled in the art will appreciate, the ABS or air bearing surface is the portion of the head that faces the magnetic medium during operation. As fly heights become ever smaller, the fly height may approach a distance, where the head could be considered to be in contact with the medium. Therefore, ABS should be understood to describe the surface of the head that faces the magnetic medium regardless of the distance from the medium during operation.

Figure 5:
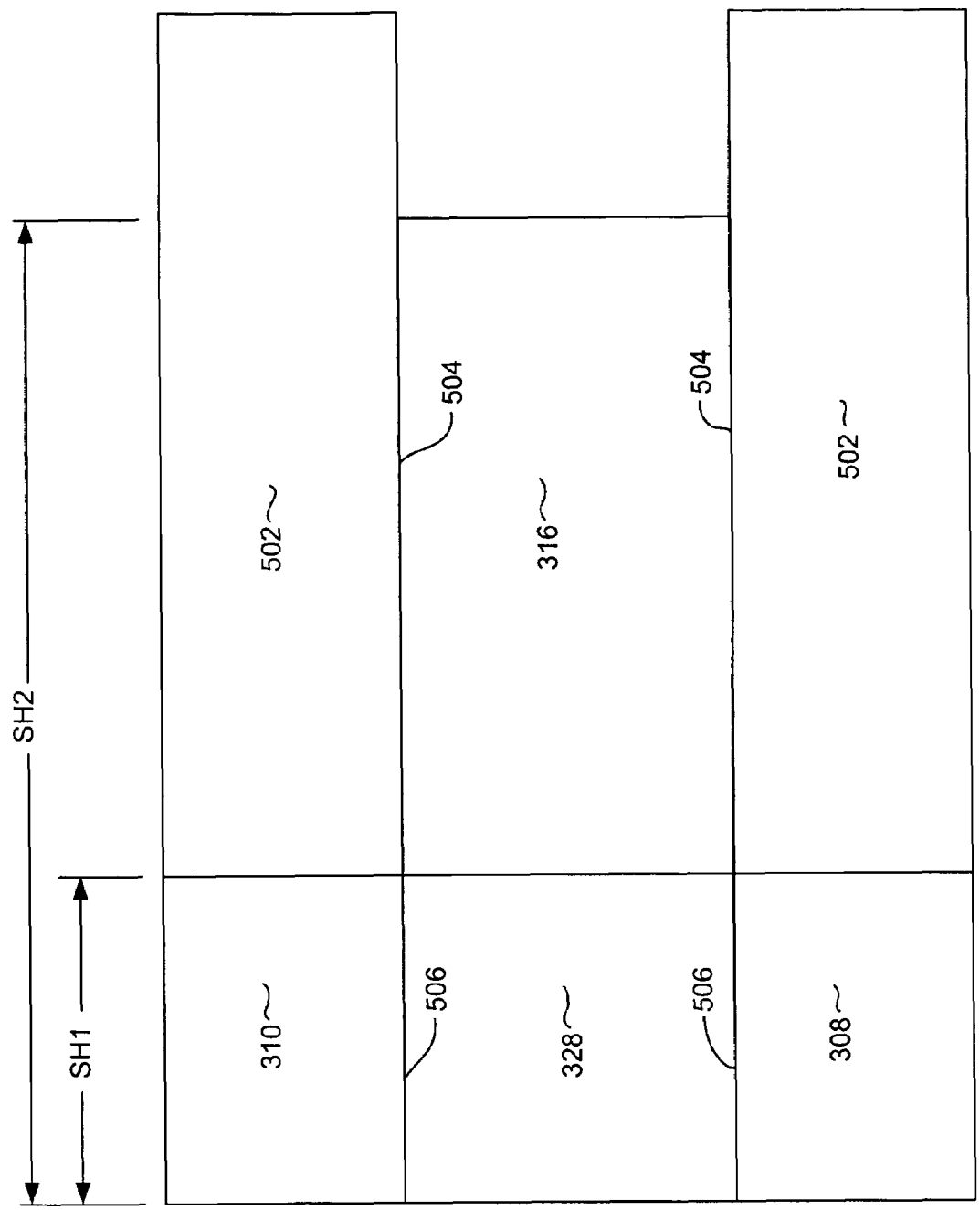
FIG. 5 is a plan view of a sensor according to an embodiment of the invention.
Figure 6:
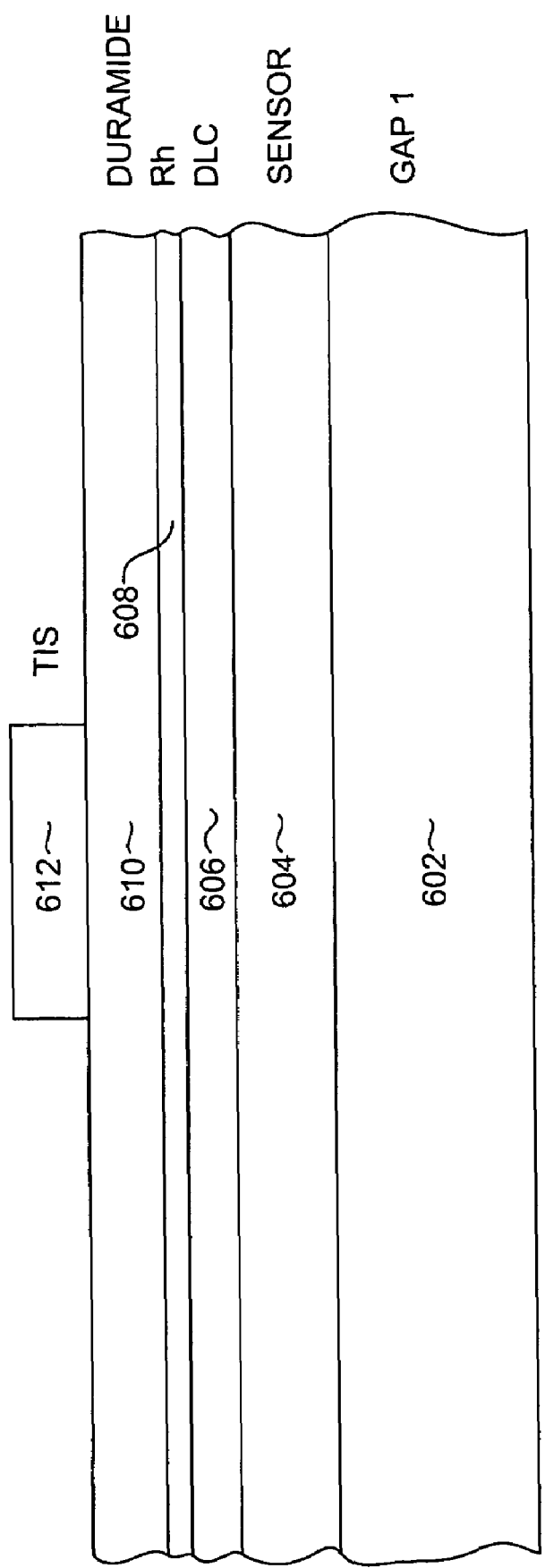
FIGS. 6-21 are views of a magnetoresitive sensor according to an embodiment of the invention, shown in various intermediate stages of manufacture to illustrate a method of manufacturing a device according to an embodiment of the present invention.

With reference to FIG. 5, the leads 308, 310 and hard bias layers located there under, have a back edge that terminates at the same stripe height SH1 as the back edge of the free layer 312 (FIG. 4) located under the cap layer 328. The pinned layer 314 is hidden beneath the spacer layer 316 in FIG. 5. However, it should be understood that the pinned layer 314 and spacer layer 316 extend to an extended stripe height SH2 as previously discussed and has an insulation layer 502 formed at either side, rather than the electrically conductive lead and hard bias layers 305, 307, 308, 310. If the electrically conductive hard bias and lead layers 305, 307, 308, 310 were to extend along the sides of the extended portion of the pinned layer 314 beyond the first stripe height SH1 termination of the free layer 312, then a prohibitively large amount of electrical current would be shunted through the free layer, making the sensor 300 inoperable.

It should also be pointed out that, as seen in FIG. 5, the sides 504 of the pinned layer 320 and spacer 316 in the extended portion are perfectly aligned with the sides 506 of the sensor in the active portion of the sensor within SH1. The pinned layer 320 cannot actually be seen in FIG. 5, because the pinned layer is hidden under the spacer layer 316. However, the sides 506 extend down into the plane of the page to form sides of the pinned layer as well as the spacer layer 316. This perfect alignment is critical to proper magnetic performance of the sensor, assuring that there will be no shunting of current and that the magnetic anisotropy of the pinned layer 314 will assure stable pinning of the pinned layer.

Extending the pinned layer beyond the stripe height SH1 of the sensor stack 302 provides a very strong magnetic anisotropy in a direction perpendicular to the ABS. This shaped induced anisotropy can be several hundred Oe or larger. Furthermore, this strong magnetic anisotropy is advantageously unaffected by other factors such as the size of the sensor or by mechanical stresses. What's more, this anisotropy is completely additive to other pinning mechanisms such as AP pinning, AFM pinning or pinning with a hard magnet.

As mentioned above, it is important that the sides 504 of the extended portion be aligned with the sides 506 of the active sensor portion. The difficulty in achieving this alignment can be appreciated, however, by considering that current lithographic processes cannot align better than 30 to 50 nm and that sensor width dimensions are on the order of only 50 nm. As one can appreciate, a completely novel manufacturing process is needed to construct a sensor having an extended pinned layer such as that described.

With reference now to FIGS. 6-21 a novel manufacturing method is described. This method makes use of a single mask structure for multiple manufacturing processes, re-using a single mask structure so that multiple mask alignments are not necessary. It should be pointed out that, while this recycled mask process is being described in terms of manufacturing the above described sensor structure, in a more general sense this multiple-use mask process can be used to construct many different structures including those other than read/write magnetic heads such as in semiconductor or integrated circuit designs. Furthermore, while the multiple-use mask process is described as using a single mask for two manufacturing processes the mask structure could be used more than two times for many multiple processes.

To illustrate the process with regard to the particular structure described above, with reference now to FIG. 6, a substrate, such as a first gap 602 is provided, on top of which the various sensor layers 604 are deposited as full film layers. Although shown as a single layer in FIG. 6, it will be understood that the layer 604 actually includes the various, multiple layers that make up the sensor stack 302 as described above.

A mask structure is deposited by first depositing a layer of material that is resistant to chemical mechanical polishing (CMP resistant layer) 606. This material can be, for example diamond like carbon (DLC). Although other materials could be used, this CMP resistant layer 606 will be referred to as DLC layer 606.

A layer of material 608 that is both resistant to removal by CMP and also resistant to removal by reactive ion etching (CMP resistant and RIE resistant) is then deposited full film over the DLC layer 608. Although several materials could be used as such a CMP resistant and RIE resistant layer 608, the layer 608 is preferably constructed of Rh, and will hereinafter be referred to as Rh layer 608. It should however be understood, that the layer 608 could be some material other than Rh. A transfer mask layer 610 such as DURAMIDE™ may then be deposited and a photosensitive mask such as TIS or photoresist 612 is then constructed to have a width to define the track width of the sensor. The TIS mask 612 can be constructed according to methods that will be familiar to those skilled in the art, including spinning on a photoresist material and then patterning and developing the photoresist mask 612.

Figure 7:
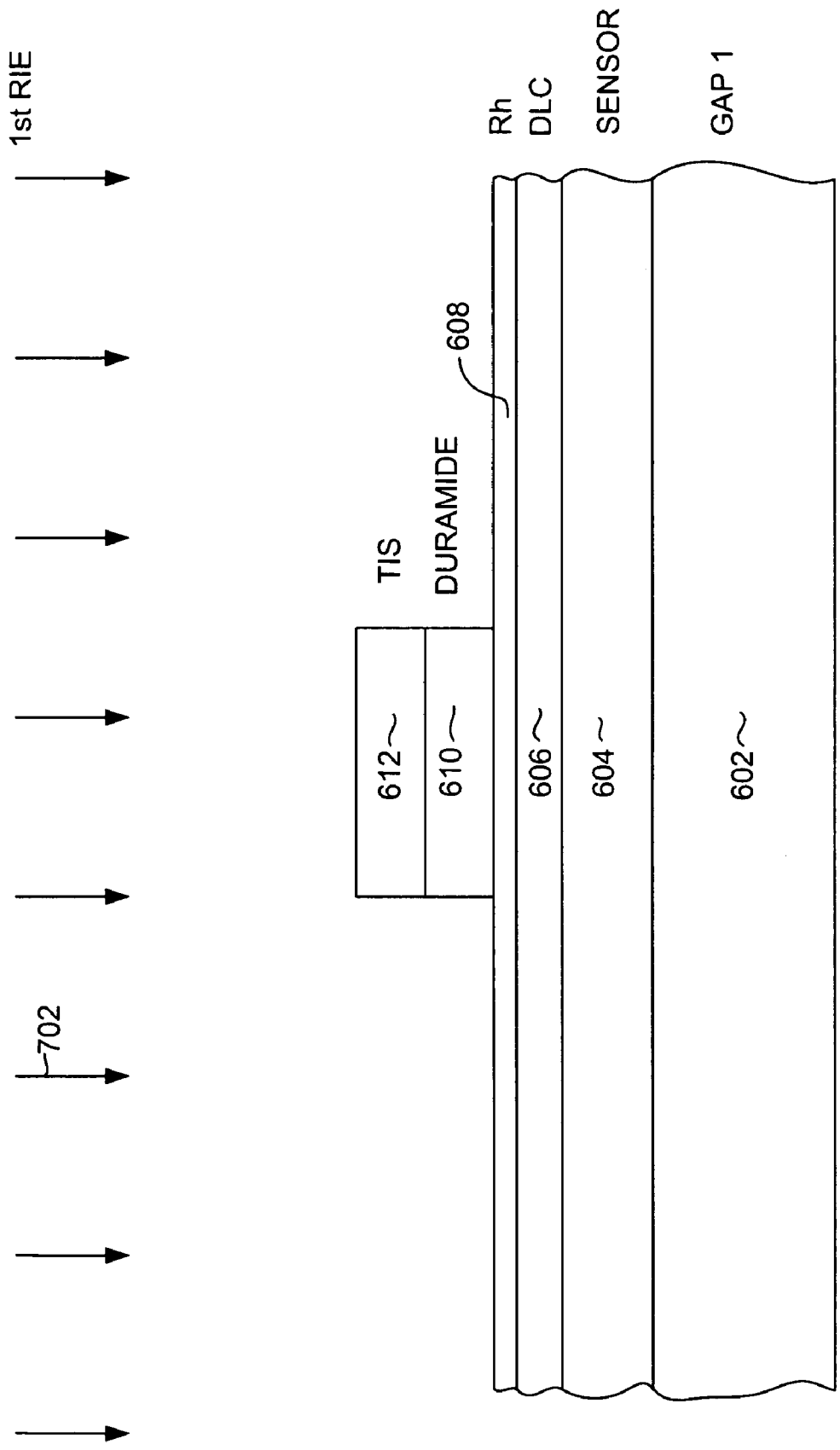
Figure 8:
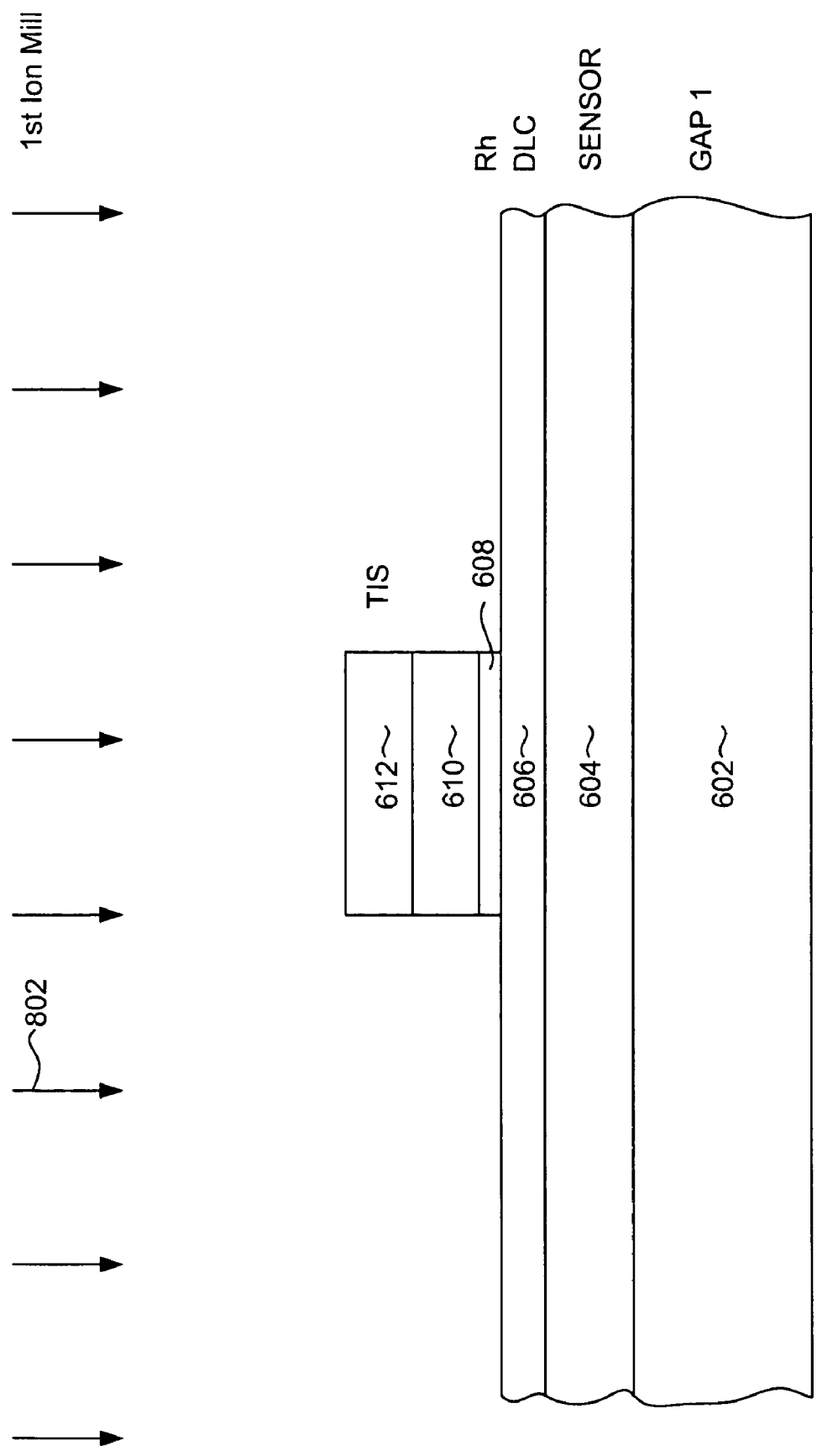
Figure 9:
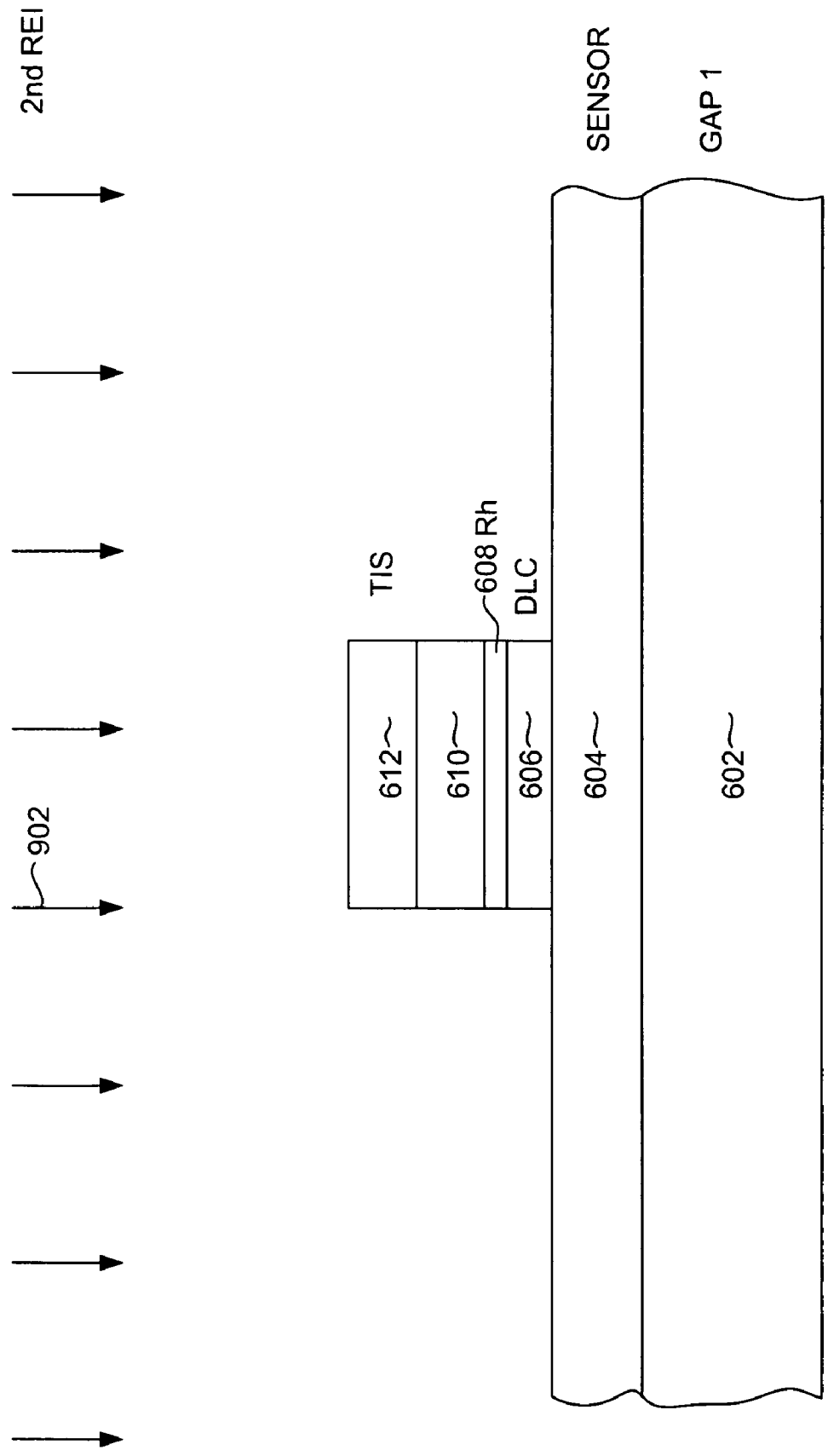

With reference now to FIG. 7, a $1^{st}$ reactive ion etch, ($1^{st}$ RIE 702) is performed to transfer the image of the photoresist layer 612 onto the underlying non-photosensitive material 610. Then, with reference to FIG. 8, a first ion mill 802 is performed to remove portions of the Rh layer that are not protect by the overlying mask layers 610, 612. Thereafter, with reference to FIG. 9 a second RIE 902 is performed to remove portions of the DLC layer that are not protected by the overlying mask layers 608, 610, 612.

Figure 10:
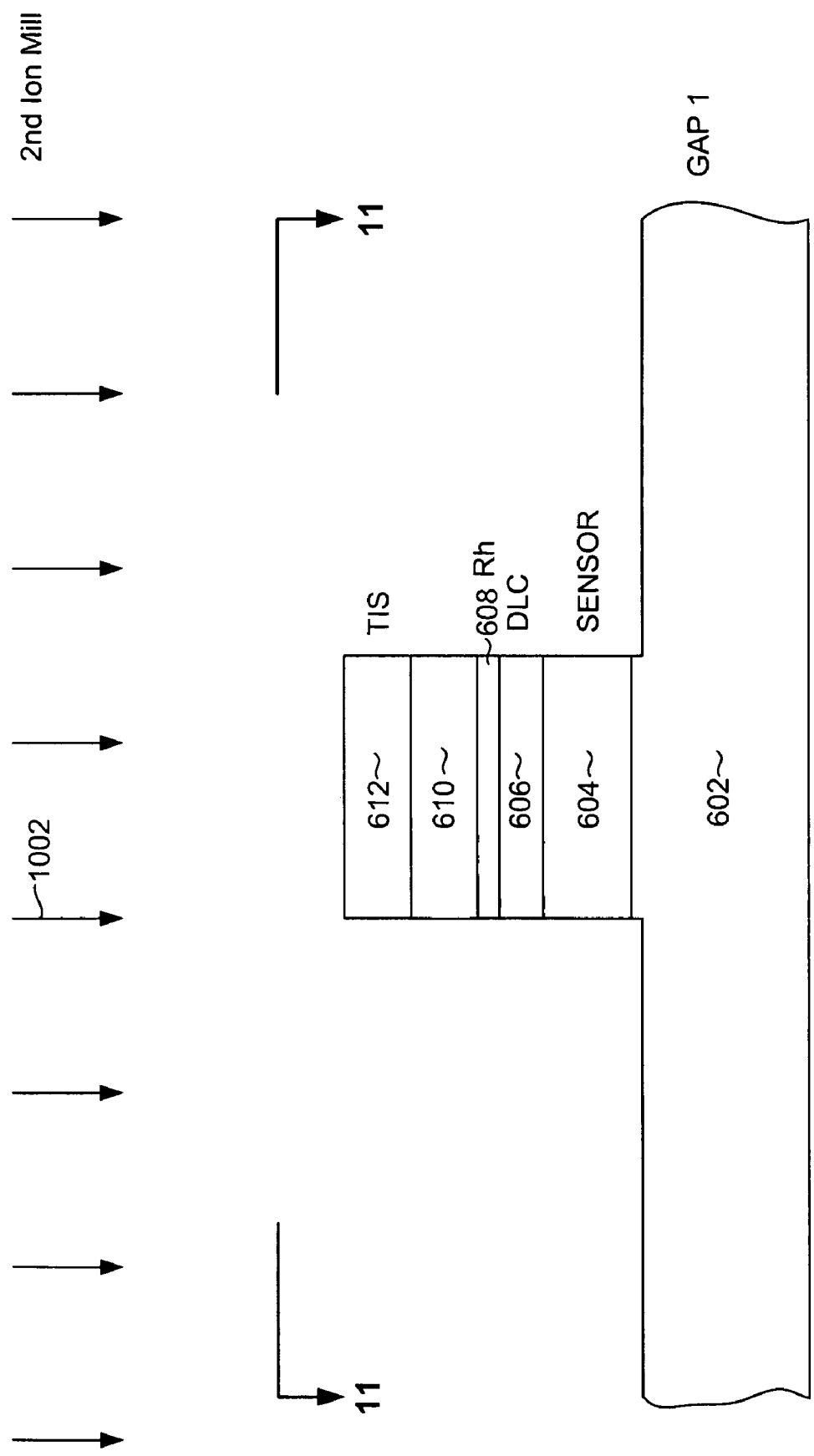
Figure 11:
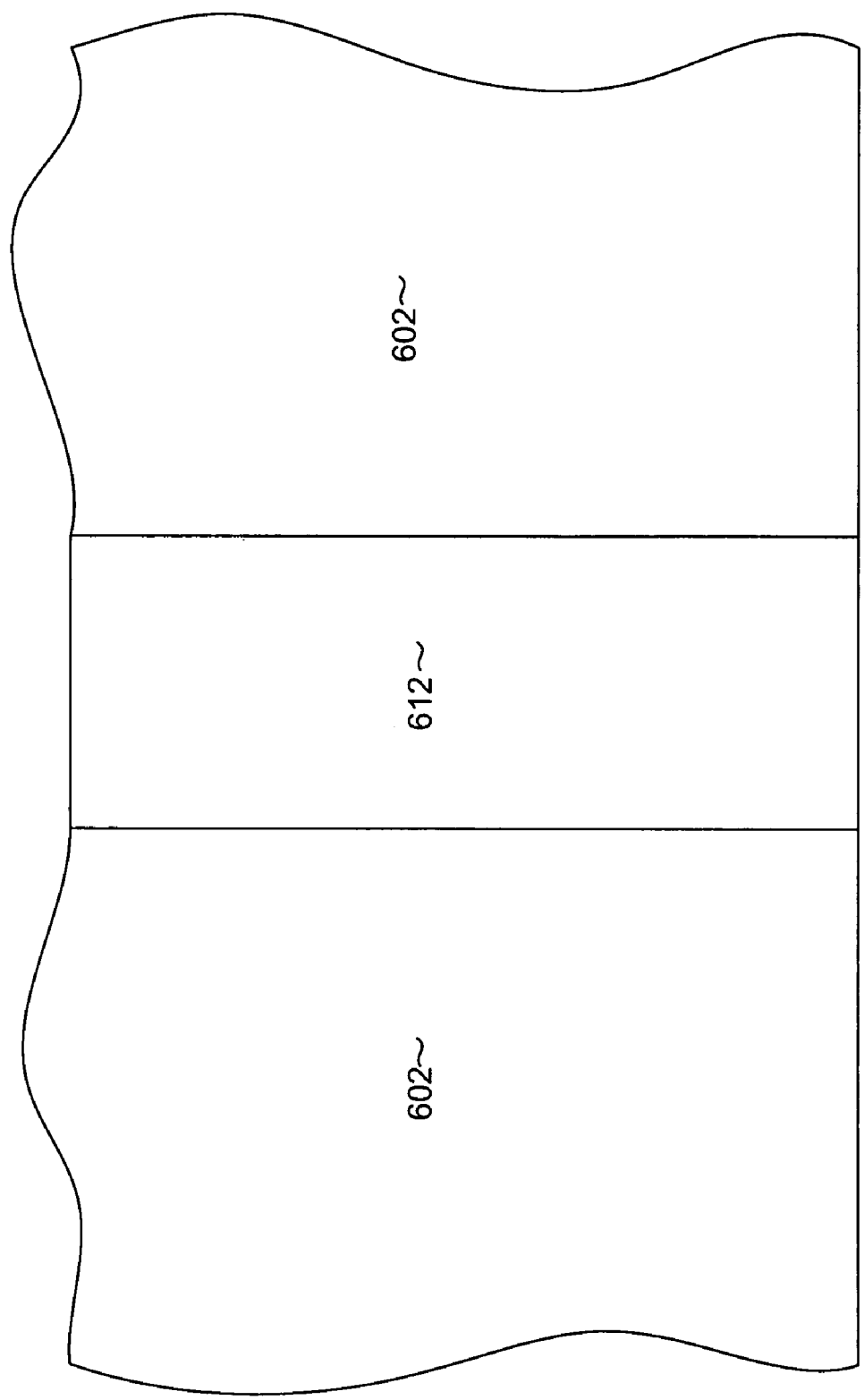

With reference now to FIG. 10 a second ion mill 1002 is performed, using mask layers 606-612 to define the track width of the sensor 300 (FIG. 3) by removing sensor material 604 that is not protected by the overlying mask layers 606-612. This is the first use of the mask structure 606-612, in which the mask is used to define the trackwidth of the sensor. FIG. 11, which shows a top down view of the structure described in FIG. 10, shows that the pattern defined in the sensor and mask layers 602-612 extends a substantial amount in the stripe height direction.

Figure 12:
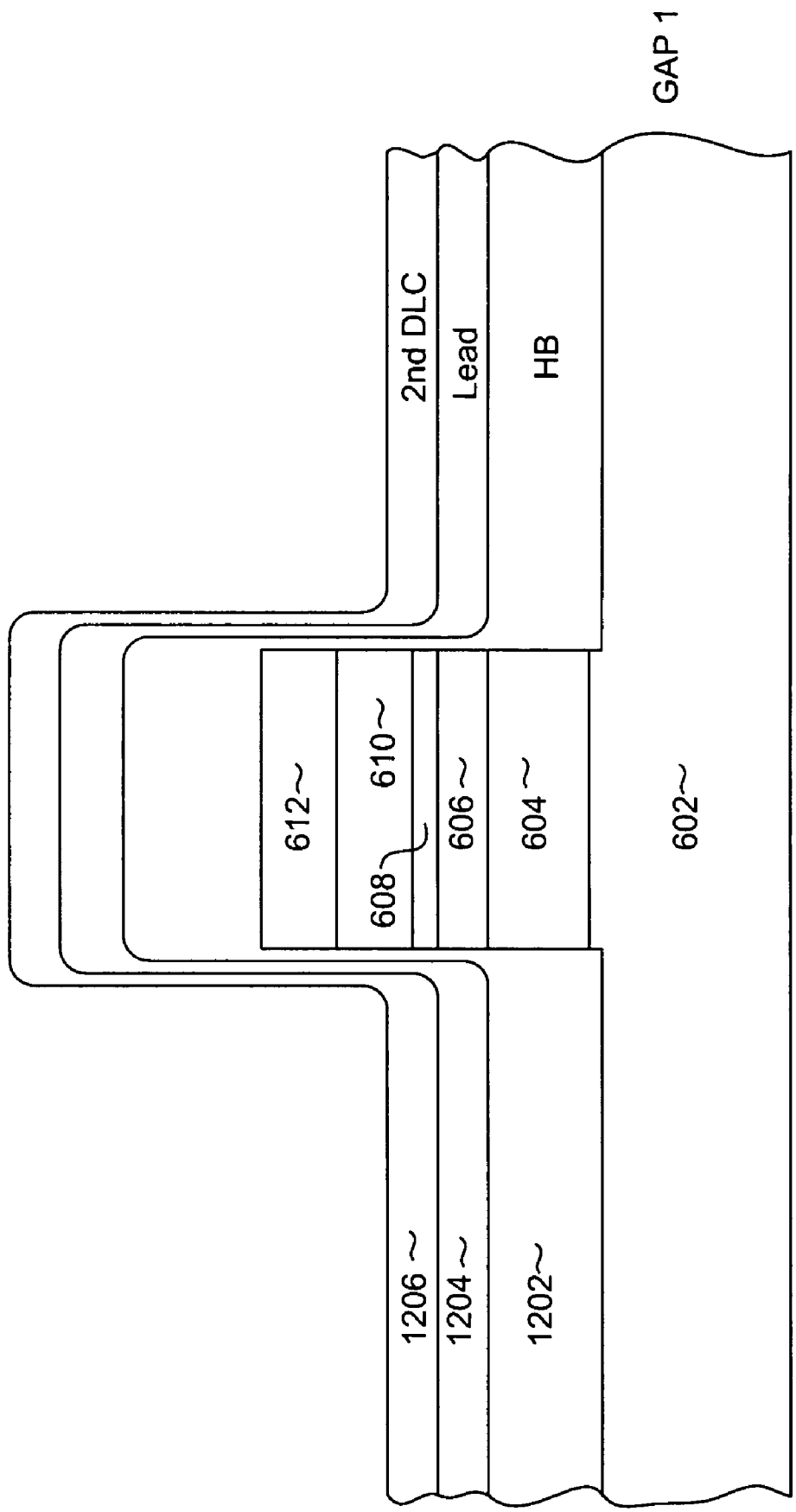

With reference now to FIG. 12, a layer of hard magnetic material HB 1202 is deposited as a full film layer. The HB layer 1202 can be, for example CoPtCr or some other material. A layer of electrically conductive lead material 1204 is then deposited. The lead material 1204 can be for example Rh, Au, Cu or some other suitable material. A second layer of CMP resistant material ($2^{nd}$ DLC layer) 1206 is then deposited over the HB and lead layers 1202, 1204.

Figure 13:
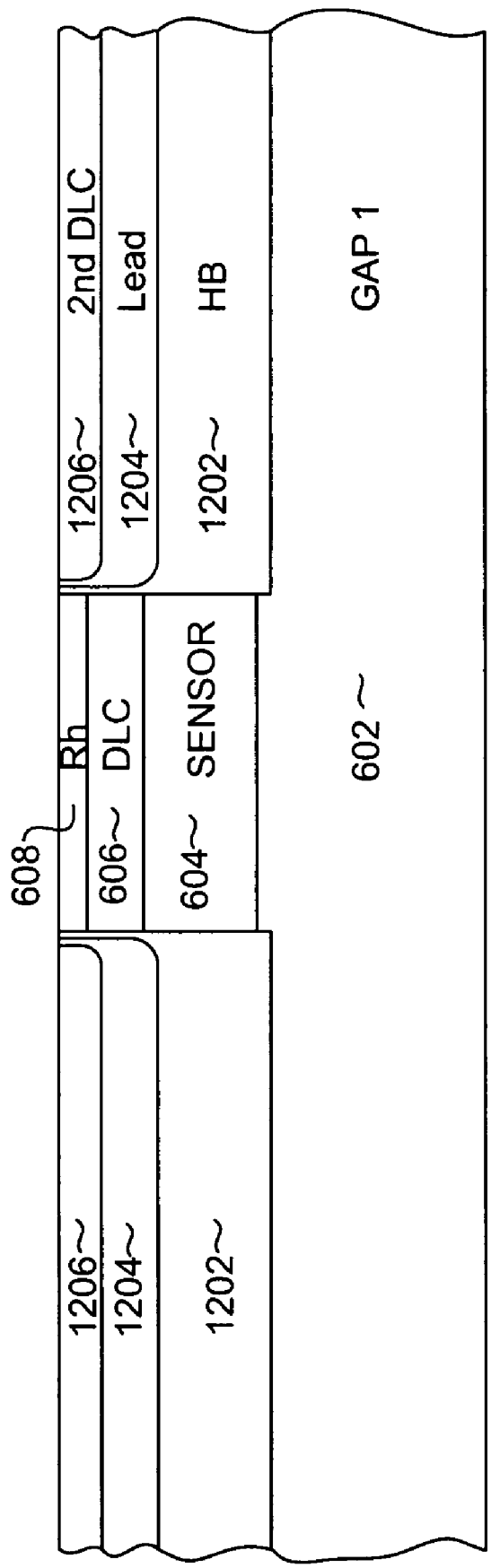
Figure 14:
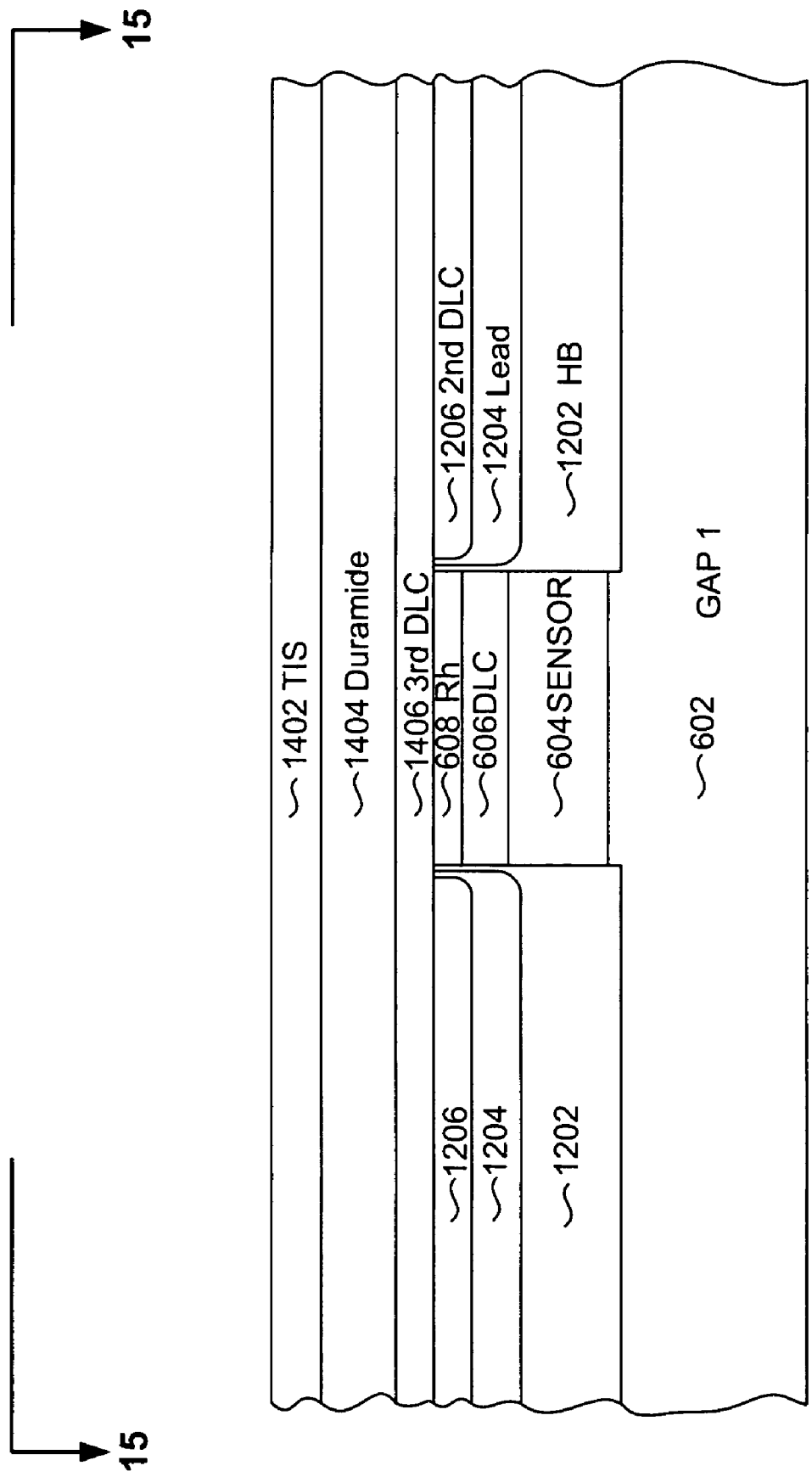
Figure 15:
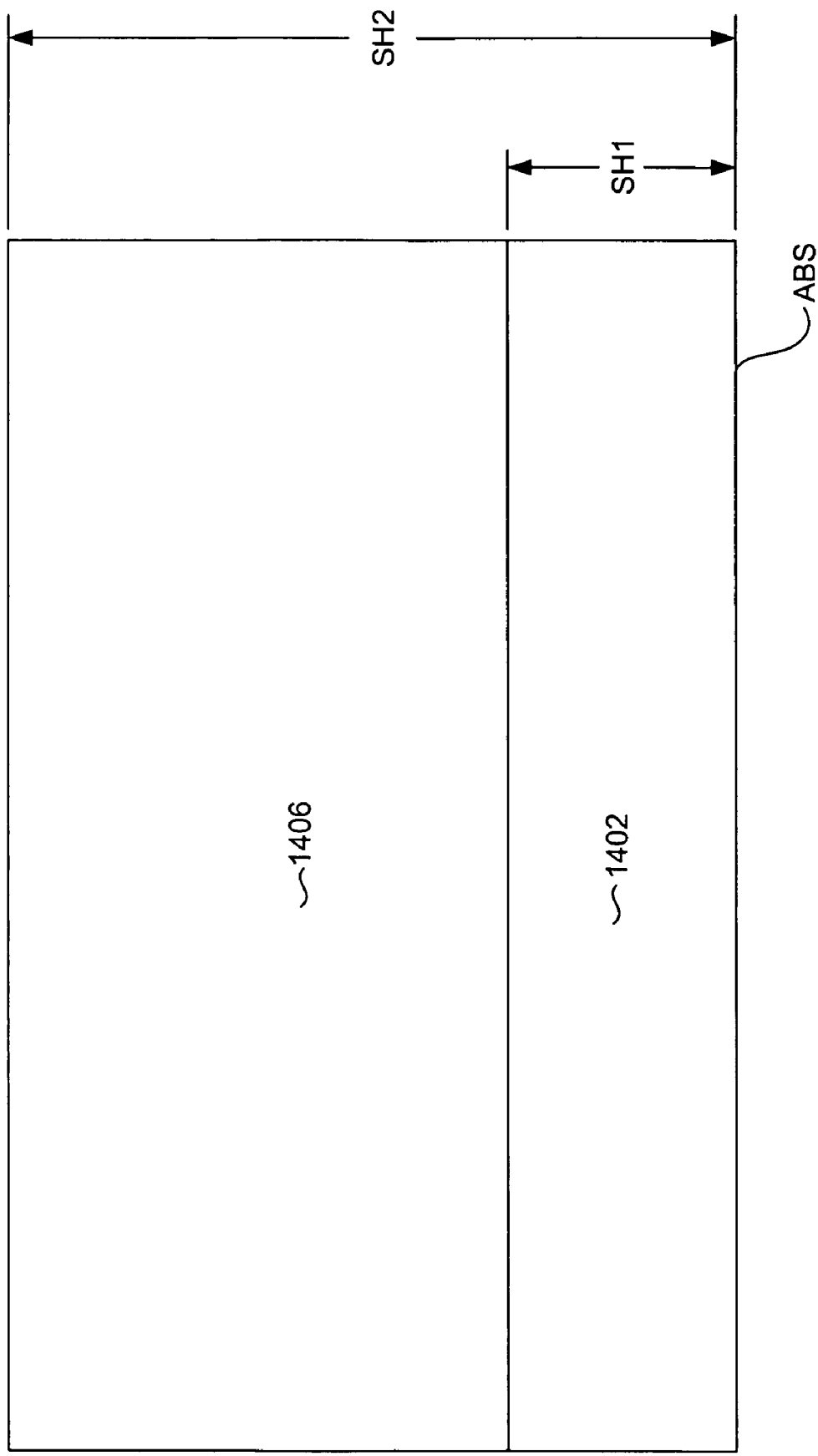

With reference now to FIG. 13, a chemical mechanical polishing process (CMP) is performed. The CMP removes the tall topography of the mask structure, planarizing the deposited structure down to the level of the Rh layer 608 and the second DLC layer 1206. The Rh layer 608 is a CMP stop layer that protects the sensor layers 604 from the CMP process, and the second DLC layer 1206 protects the lead and hard bias layers 1202, 1204. With reference to FIGS. 14 and 15, a second mask structure is formed. The mask structure preferably includes patterned TIS layer 1402 such as photoresist and an image transfer layer 1404 such as DURAMIDE. A third CMP resistant layer ($3^{rd}$ DLC layer) 1406 may also be deposited as a full film layer, beneath the image transfer layer 1404 and TIS 1402. This second mask structure 1402, 1404 is constructed to define the stripe height of the active area of the sensor by defining the stripe height of the free layer. In other words it covers the area from the ABS (future ABS location) to SH1. This can be seen more clearly with reference to FIG. 15.

Figure 16:
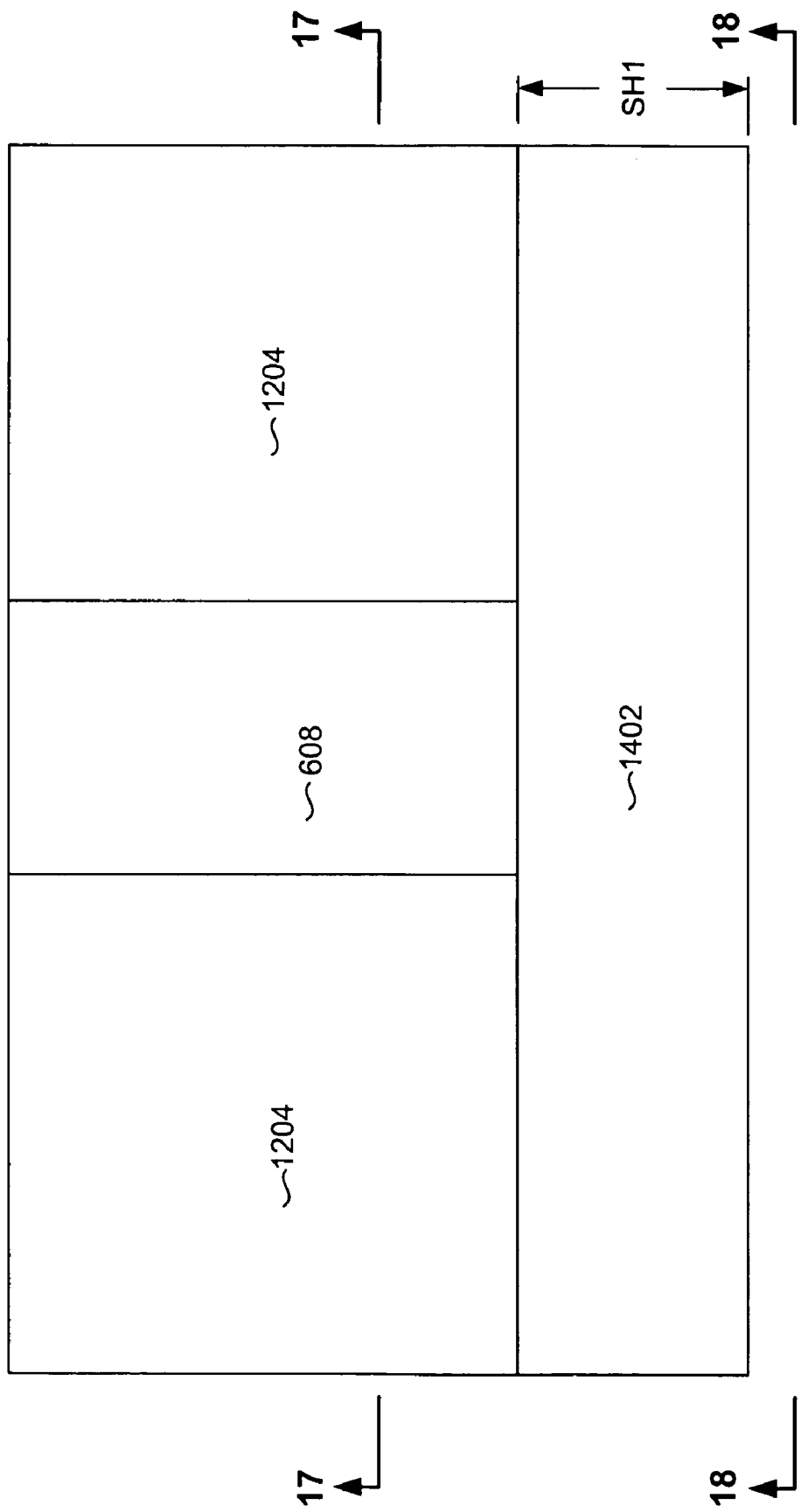
Figure 17:
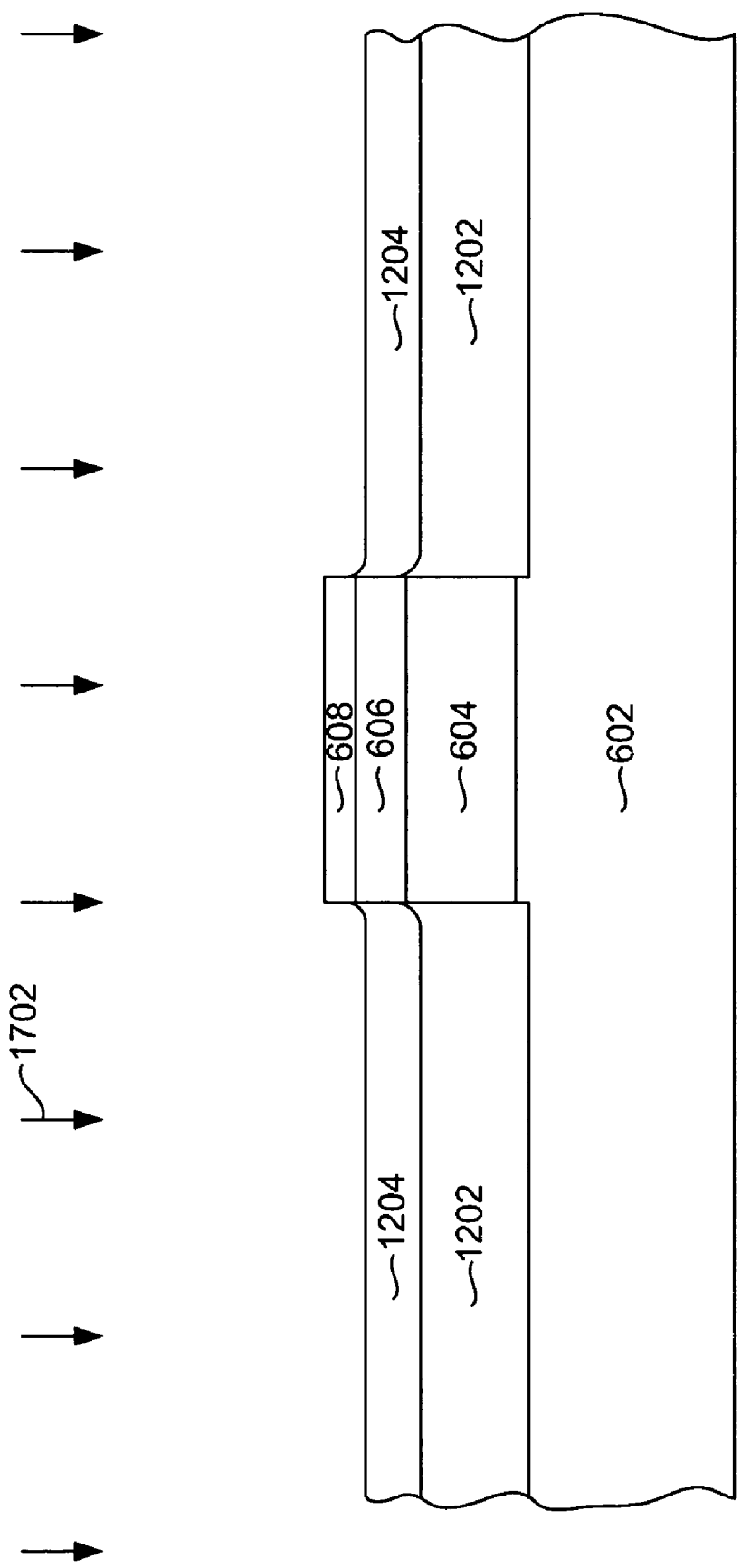

With reference now to FIGS. 16 and 17, a third reactive ion etch (RIE) 1702 is performed. This third RIE 1702 removes the second and third DLC layers 1206, 1406 from the area over the leads 1204. This third RIE 1702 does not, however, remove the Rh layer 608, because Rh layer 608 is resistant to removal by RIE. As mentioned before, use of Rh for the RIE/CMP resistant layer 608 is by way of example, and other materials could be used.

Figure 18:
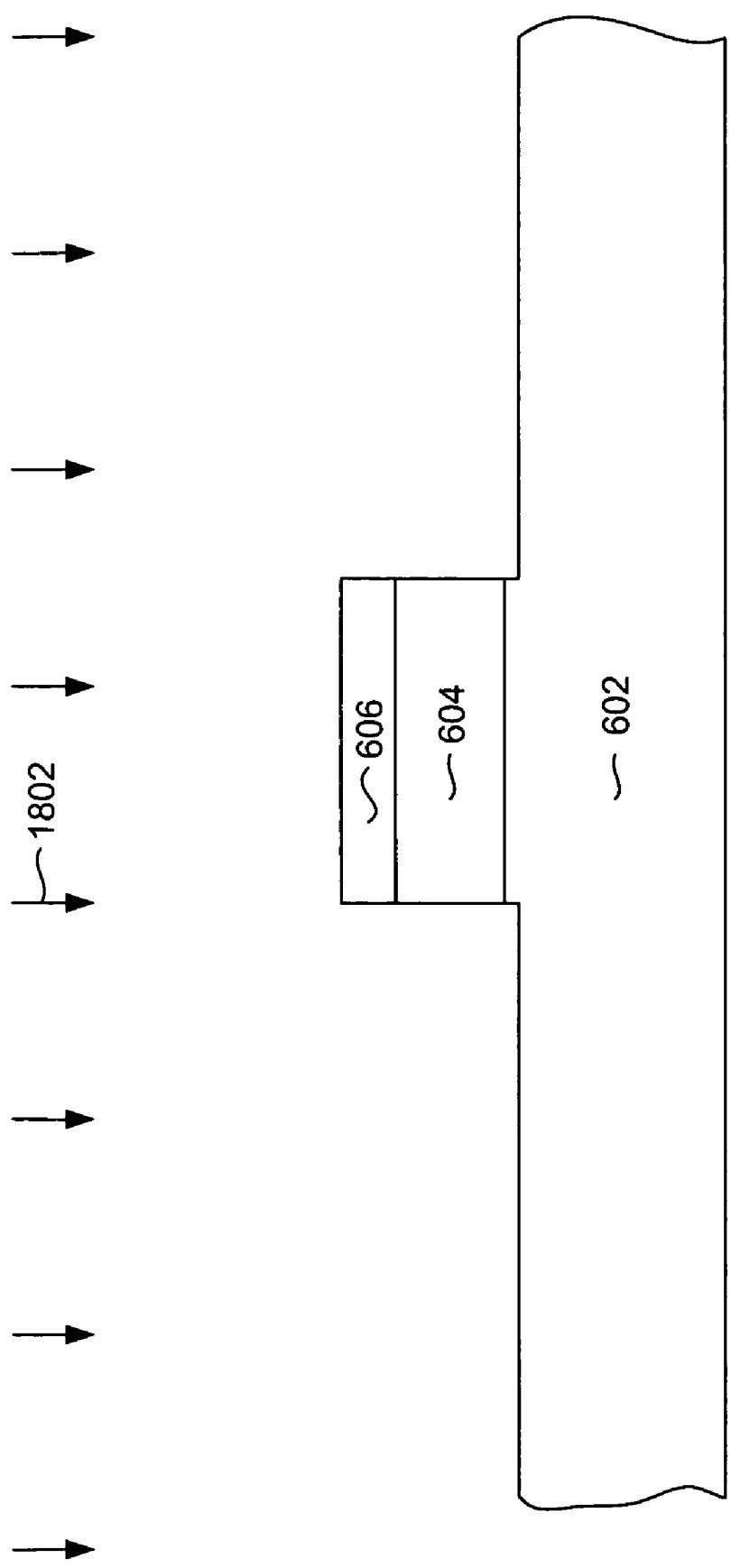
Figure 19:
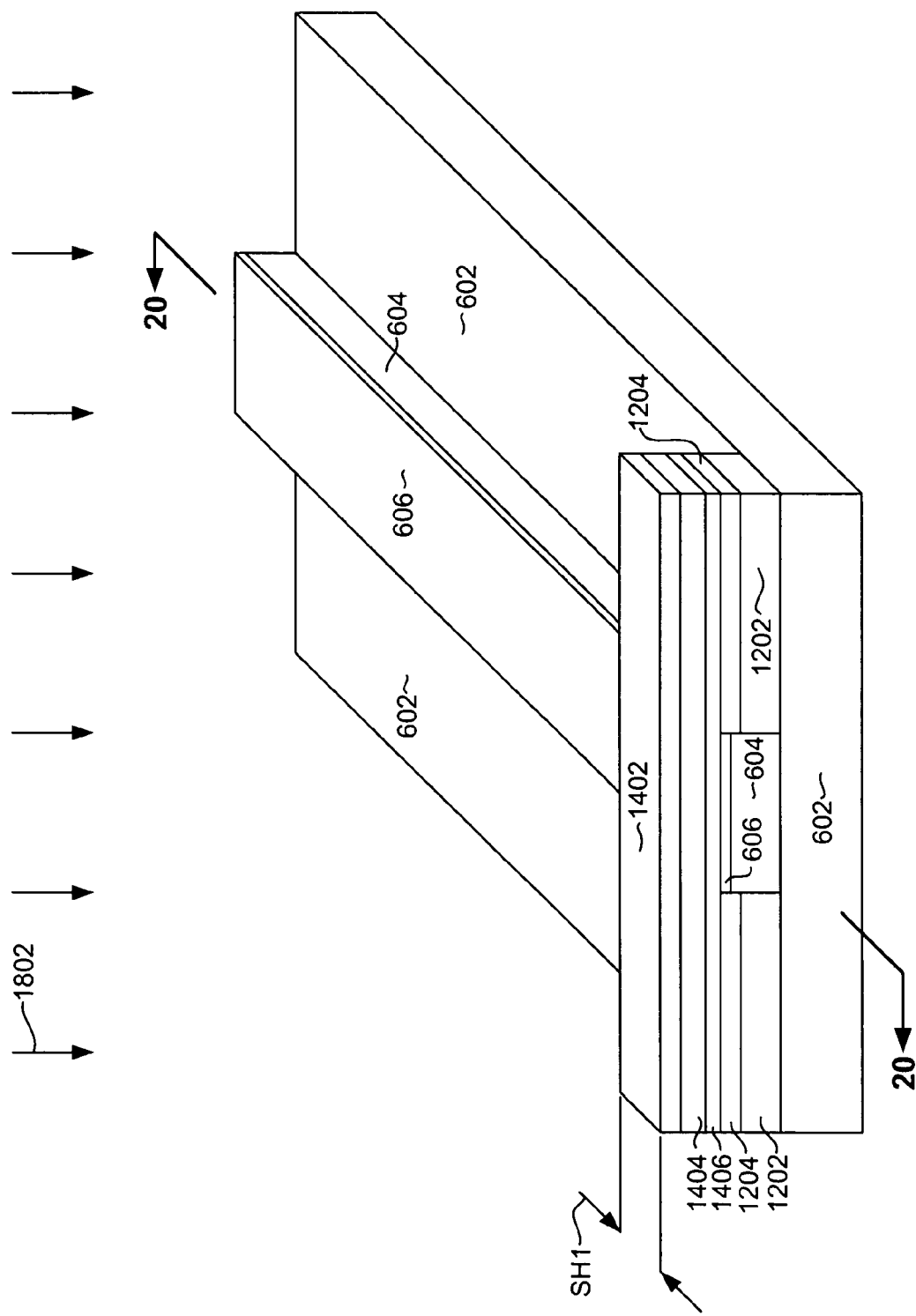

With reference now to FIG. 18, a third ion mill 1802 is performed. This ion mill 1802 removes the HB and lead material 1202, 1204 from the areas not covered by the second mask structure. Therefore, the hard bias and lead material 1202, 1204 is removed only from areas beyond SH1 (ie beyond the stripe height of the free layer as will be described below). The third ion mill 1802 also removes most or all of the Rh layer 608, leaving the first DLC layer 606 exposed. With reference to FIG. 19 it can be seen that the second mask structure 1402, 1404 is still in place so the leads and HB layers are not affected by the third ion mill 1802 in areas adjacent to the active area of the sensor (between the ABS and SH1). FIG. 19 shows an isometric view of the structure thus far, which may better illustrate the structure.

Figure 20:
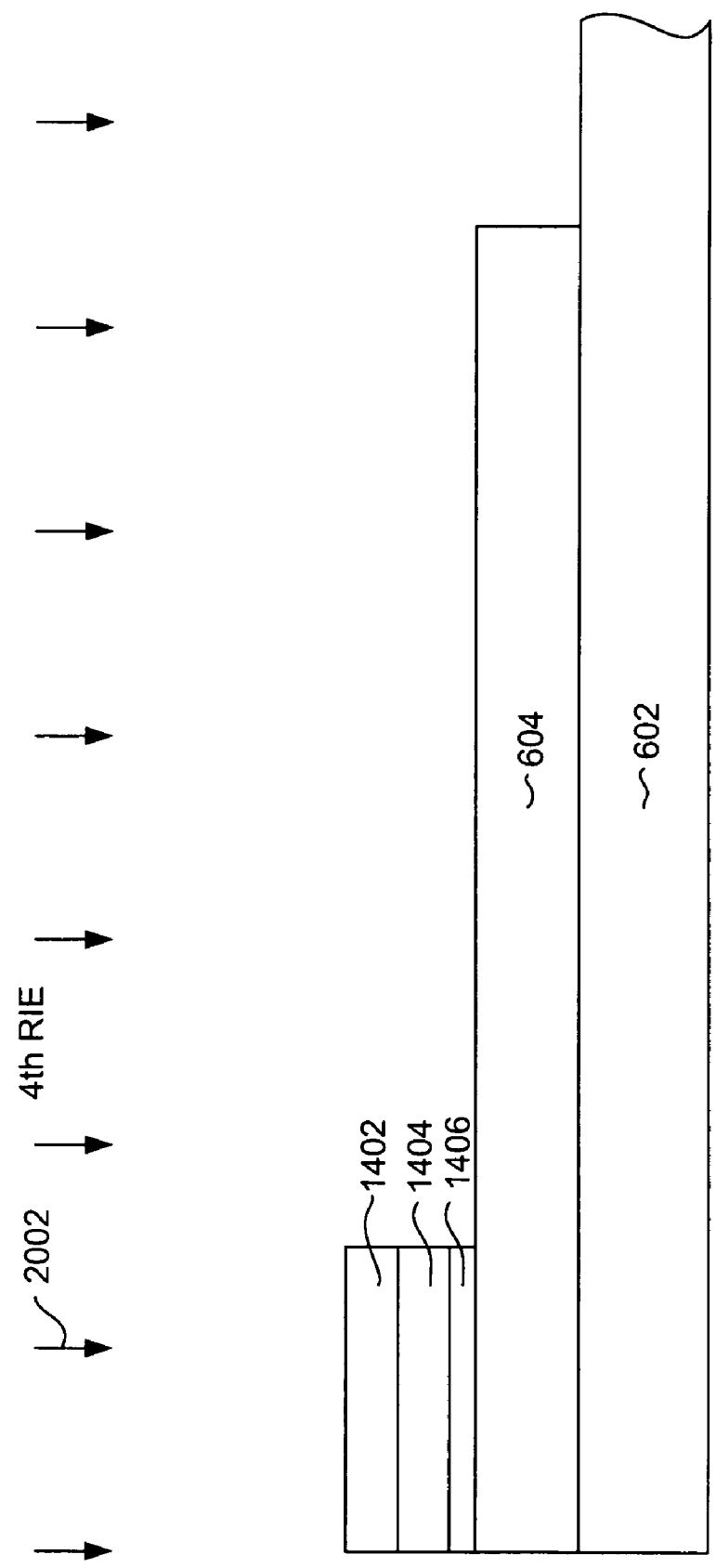

With reference now to FIG. 20 a fourth RIE 2002 is performed to remove the first CMP layer 606 from over the sensor layers 604 in the area beyond SH1. With the third CMP layer 1406 removed during the third RIE 1302 and the Rh layer 608 removed during the previous ion mill process 1802, the CMP layer 606 can be readily removed by RIE.

Figure 21:
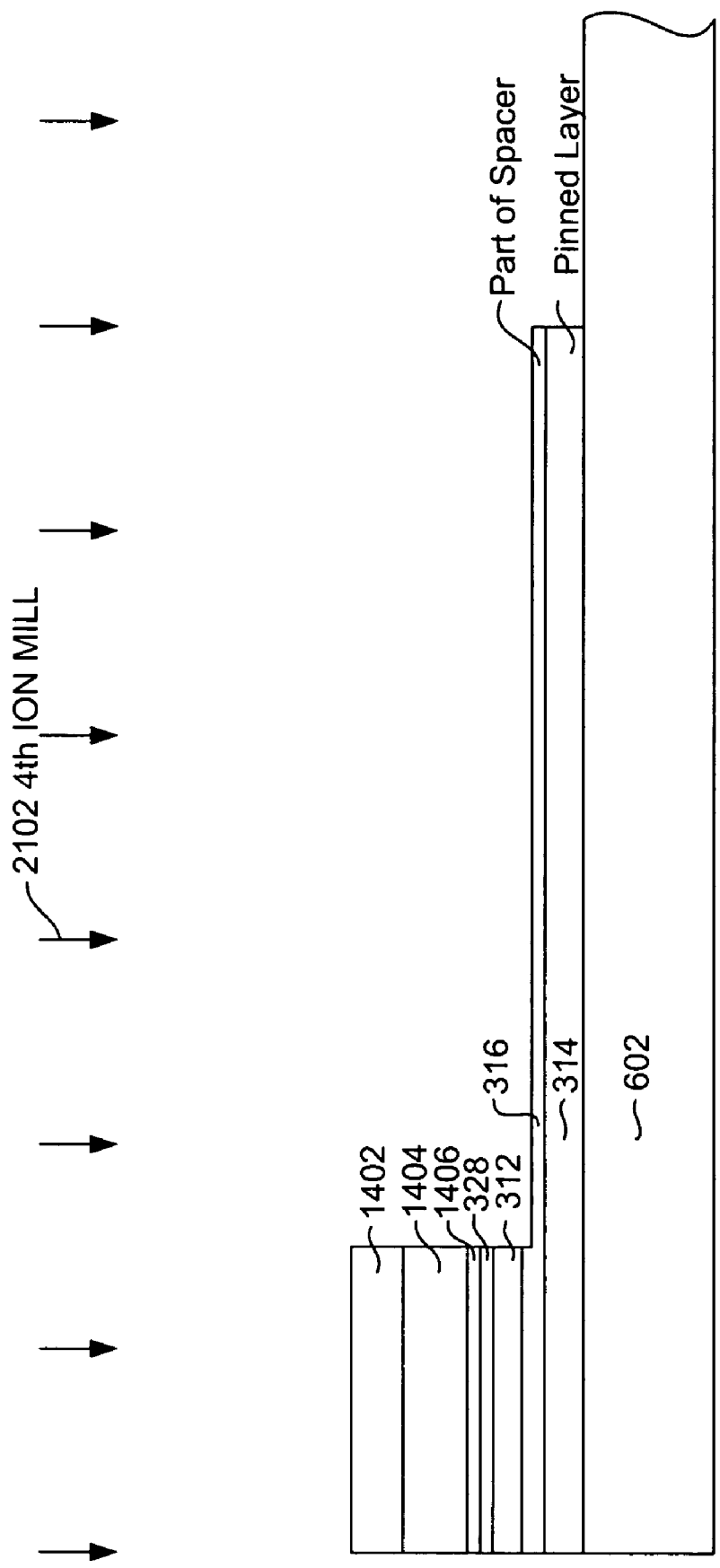

With reference now to FIG. 21, a fourth ion mill process 2102 can be performed to remove selected portions of the sensor layer 604. The ion mill process 2102 can be performed sufficiently to remove the free layer 312 (FIG. 3, 4) but can be terminated before removing the pinned layer structure 314. The fourth ion mill process 2102 can be performed sufficiently to leave all or a portion of the spacer 316 intact in the area beyond SH1.

Figure 22:
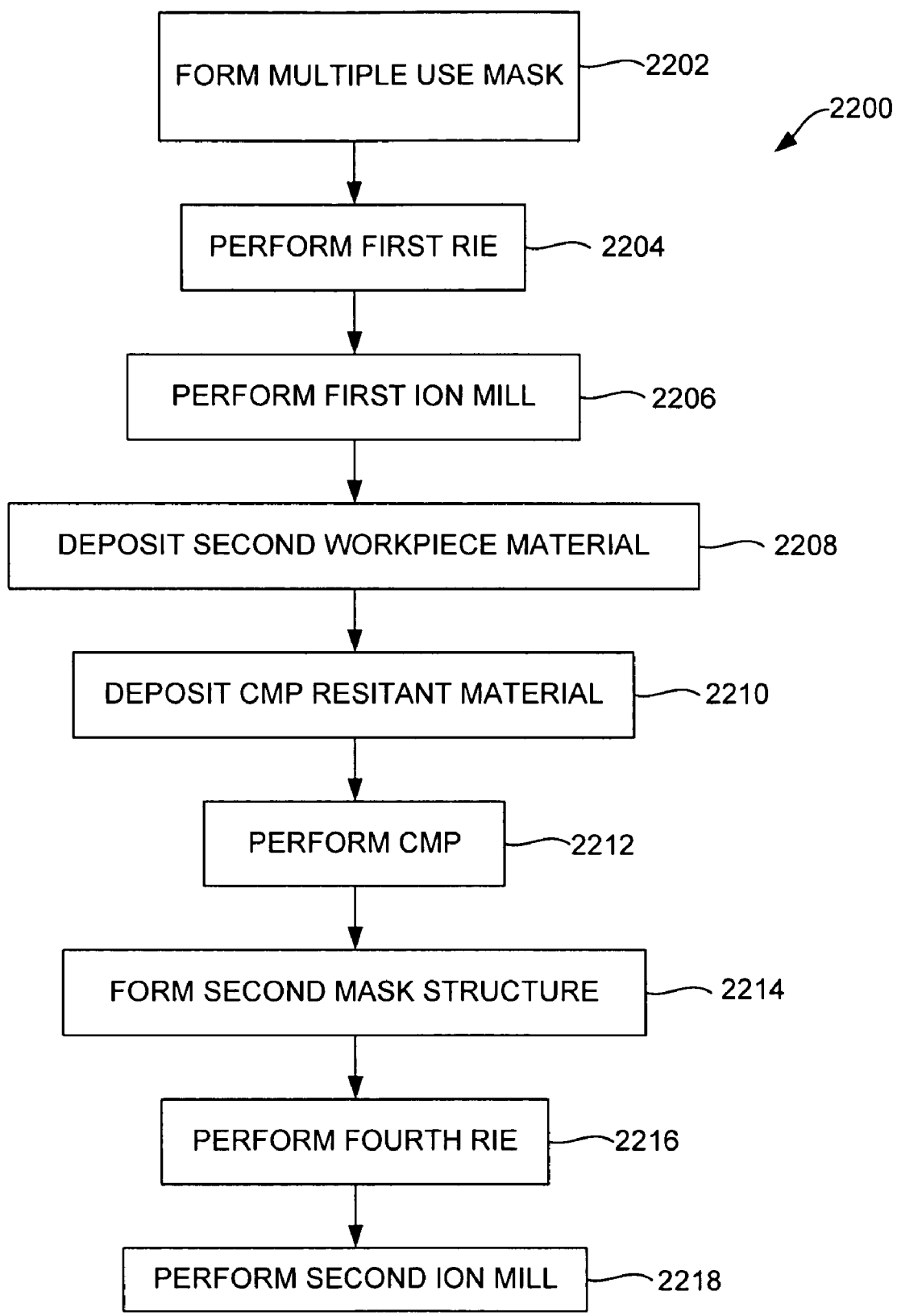
FIG. 22 is a flowchart illustrating a method of using a multiuse mask structure to construct a device according to an embodiment of the invention.

It should be pointed out again that, while the concept of using a single mask structure for multiple manufacturing processes has been described above in terms of constructing the above described magnetoresistive sensor structure, in a more general sense this multi-use mask structure can be used to construct any number or structures. With reference to FIG. 22, in more general terms, a method 2200 of using a multiple-use mask structure can be described as follows. In a step 2202 A multiple-use mask is constructed on top of a workpiece structure. The workpiece structure can be sensor layers (as described above) or could be some other materials to be worked on. The multiple use mask structure includes: (1) a first layer of CMP resistant/ion mill resistant material such as DLC, (2) a second layer of ion mill, RIE and CMP resistant material such as Rh deposited over the first layer, and (3) a photolithographic mask structure (which may include an image transfer mask and a TIS) formed over the second layer. In a step 2204, a first reactive ion etch (RIE) may be performed to transfer the image of the TIS onto the image transfer layer. Then, in a step 2206 a first ion mill is performed to remove portions of the workpiece material not protected by the first mask structure. Then, in a step 2208 a second workpiece material may be deposited. This may be the hard bias and lead layers described above, or could be another material in another utilization of the invention. In a step 2210 a third layer, comprising a CMP resistant material such as DLC (second DLC layer) is deposited full film, so as to protect the second workpiece material deposited in step, 2208. Then, in a step 2212 a CMP can be performed.

In a step, 2214 a second mask structure is constructed, preferably covering an area different from the first mask structure. In a step 2216 a fourth RIE can be performed. In areas not protected by the second mask structure the third layer (second DLC layer) will be removed from areas not protected by the Rh layer of the first mask structure. Then, in a step 2218, another ion mill can be performed to remove materials not covered by either of the first and second mask structures.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
   a pinned layer;
   a free layer; and
   a spacer layer sandwiched between the free layer and the pinned layer; and wherein:
   the pinned layer, free layer and spacer layer each have an edge located at an air bearing surface location (ABS location);
   the free layer extends from the ABS location to a stripe height location;
   the pinned layer has a portion that is disposed between the ABS location and stripe height location and a portion that extends beyond the stripe height location away from the ABS, the portion disposed between the ABS and stripe height being laterally aligned with the portion extending beyond the stripe height location; further comprising:
   an electrically conductive material extending laterally from the sides of the sensor and extending from the ABS to the stripe height location, the electrically conductive material terminating at the stripe height location; and
   an electrically insulating material extending from the sides of the pinned layer, the electrically insulating material initiating at the stripe height and extending a distance beyond the stripe height.

2. A sensor as in claim 1 wherein the pinned layer has first and second contiguous sides that extend from the ABS to a location beyond the stripe height location.

3. A sensor as in claim 1 wherein the pinned layer has first and second sides that each define a substantially straight contiguous line extending from the ABS through the portion extending beyond the stripe height.

4. A sensor as in claim 1 wherein a portion of the spacer layer extends beyond the stripe height location.

5. A sensor as in claim 1 wherein the free layer extends from the ABS to a first stripe height distance, and the pinned layer extends from the ABS to a second strip height distance that is at least two times the first stripe height distance.

6. A sensor as in claim 1 further comprising an electrically conductive material extending laterally from the sides of the sensor and extending from the ABS to the stripe height location, the electrically conductive material terminating at the stripe height location.

7. A suspension assembly, comprising:
   a suspension arm;
   a slider connected with an end of the suspension arm;
   an inductive write element connected with the slider; and
   a magnetoresistive sensor, comprising:
   a pinned layer;
   a free layer; and
   a spacer layer sandwiched between the free layer and the pinned layer; and wherein:
   the pinned layer, free layer and spacer layer each have an edge located at an air bearing surface;
   the free layer extends from the ABS to a stripe height location;
   the pinned has a portion that disposed between the ABS and stripe height location and a portion that extends beyond the stripe height location away from the ABS, the portion disposed between the ABS and stripe height being laterally aligned with the portion extending beyond the stripe height location; further comprising:
   an electrically insulating material extending from the sides of the pinned layer, the electrically insulating material initiating at the stripe height and extending a distance beyond the stripe height.

8. A magnetic data recording, system, comprising:
   a housing;
   a magnetic disk rotatably mounted within the housing;
   an actuator;
   a slider connected with the actuator for movement adjacent to a surface of the disk; and
   a magnetoresistive sensor connected with the slider, the sensor comprising:
   a pinned layer;
   a free layer; and
   a spacer layer sandwiched between the free layer and the pinned layer; and wherein:
   the pinned layer, free layer and spacer layer each have an edge located at an air bearing surface;
   the free layer extends from the ABS to a stripe height location;
   the pinned has a portion that disposed between the ABS and stripe height location and a portion that extends beyond the stripe height location away from the ABS, the portion disposed between the ABS and stripe height being laterally aligned with the portion extending beyond the stripe height location; further comprising:
   an electrically insulating material extending from the sides of the pinned layer, the electrically insulating material initiating at the stripe height and extending a distance beyond the stripe height.

* * * * *